United States Patent [19]

Suzuki

[11] Patent Number: 4,549,138

[45] Date of Patent: Oct. 22, 1985

[54] APPARATUS AND METHOD FOR EXAMINING AN OBJECT BY NUCLEAR MAGNETIC RESONANCE

[75] Inventor: Masaharu Suzuki, Nagoya, Japan

[73] Assignee: Tokyo Shibaura Denki Kabushiki Kaisha, Kawasaki, Japan

[21] Appl. No.: 536,452

[22] Filed: Sep. 28, 1983
(Under 37 CFR 1.47)

[30] Foreign Application Priority Data

Sep. 30, 1982 [JP] Japan ............................. 57-171877

[51] Int. Cl.$^4$ .......................................... G01N 24/06
[52] U.S. Cl. ................................................ 324/309
[58] Field of Search ............................... 324/309–310; 128/653

[56] References Cited

U.S. PATENT DOCUMENTS 4,452,250 6/1984 Chance ................................. 128/653

Primary Examiner—Kyle L. Howell
Assistant Examiner—Francis J. Jaworski
Attorney, Agent, or Firm—Cushman, Darby & Cushman

[57] ABSTRACT

An NMR apparatus and method in which the S/N ratio is improved in reception of FID signals. An oscillator includes a pre-amplifier, a driver amplifier, a final power amplifier and a bias control circuit. The operation modes of the final power amplifier can be changed by controlling the biasing voltage to the final power amplifier which is applied by the bias control circuit. While the selective exciting pulse is applied to the slice portion of the patient, the final power amplifier is being operated in class A i.e., high gain mode. Immediately after an application of the selective exciting pulse is accomplished, the operation class of the amplifier is switched to "C" e.g., low gain mode in order to receive FID signal from the excited slice portion by suppressing noise signals.

15 Claims, 14 Drawing Figures

FINAL POWER AMPLIFIER

APPARATUS AND METHOD FOR EXAMINING AN OBJECT BY NUCLEAR MAGNETIC RESONANCE

BACKGROUND OF THE INVENTION

1. Field of the Invention

The present invention relates to a diagnostic apparatus and method wherein a density distribution of a specified proton (generally, hydrogen nucleus) in biological tissue is measured externally from the object examined (i.e., a patient) in a non-invasive manner by utilizing a nuclear magnetic resonance phenomenon so as to obtain information for medical diagnosis.

2. Description of the Prior Art

Such a diagnostic apparatus is described in e.g., U.S. Pat. No. 4,254,778.

The known nuclear magnetic resonance techniques (referred to as "NMR" techniques) will now be described with reference to FIGS. 1 through 5.

A steady magnetic field is generated by an air coil C1 shown in FIGS. 1A and 1B, and a magnetic gradient field is generated by gradient field generating coils C2, C3 and C4 (FIGS. 2 and 3) assembled together with the air coil C1. FIG. 4 shows the fields illustrated diagrammatically in the side elevation in relation to a patient P. A steady field $H_0$ generated by the air coil C1 is superimposed in advance on a gradient field $G_z$ generated by the coils C2. The gradient field $G_z$ can be obtained by flowing reverse currents through a pair of Helmholtz coils C2 shown in FIG. 2. This coil pair is called a "Maxwell pair". The gradient field $G_z$ has the same direction (z-axis) as that of the steady field $H_0$ and has a zero magnetic intensity on a central plane (perpendicular to the z-axis) between the pair of coils C2 so that the absolute values of the intensities of reverse field components linearly increase in opposite directions from the above-described central plane along the z-axis (FIG. 4). The patient P is then placed in the resultant magnetic field. A selective exciting pulse $H_1$ having a proper frequency component is applied to the patient P through a pair of saddle-shaped probe head coils C5. The selective exciting pulse $H_1$ has a center frequency of 4.258 MHz (corresponding to a magnetic field of 1,000 gausses for a hydrogen nucleus) of a carrier wave and is obtained by amplitude-modulating an RF pulse by a SINC function. When the selective exciting pulse $H_1$ is applied to the patient P, resonance occurs in a plane region (cross-sectional slice region with respect to the Z axis) wherein a frequency corresponding to a vector sum of the steady field $H_0$ and the gradient field $G_z$ becomes equal to the frequency of the selective exciting pulse $H_1$. A gradient field $G_R$ obtained by a sum of vector components of gradient fields $G_x$ and $G_y$ ($G_x$ and $G_y$ are perpendicular to each other and to $G_z$) respectively generated by the gradient field generating coils C3 and C4 is applied to the slice region (i.e., chosen slice region) where resonance occurs. In this condition, when a free induction decay signal FID (referred to as "FID signal") is measured through the probe head coil C5, this signal corresponds to a signal obtained by Fourier-transforming a projection signal indicating a specific nucleus density distribution in the direction of the gradient field $G_R$ within the slice of the patient P. The direction of the gradient field $G_R$ can be varied within the x,y plane by changing the relative ratio of intensity of the field $G_x$ generated by the coils C3 to that of the field $G_y$ generated by the coils C4. A resultant free induction decay signal FID is subjected to inverse Fourier transformation, thereby obtaining projection signals in various directions in the x,y plane. By utilizing these projection signals, an image indicating the density distribution of the specific nucleus within the slice of the patient P is obtained.

As a method which does not perform image reconstruction as described above, a multi-sensitive point method is proposed and disclosed in U.S. Pat. No. 4,184,110 (1980) wherein an AC current flows through a gradient field coil to vibrate the gradient field, to accumulate FID signals and hence to extract only those signal components which are stable on the central line over a period of time.

In these conventional NMR apparatuses, a signal to noise ratio (referred to as an "S/N ratio" hereinafter) of the resultant FID signal is low, and this is the main reason for low spatial resolution of a tomographic image in medical diagnosis. Noise components mixed in the FID signal are summarized as follows:

(a) external noise (e.g., automobile ignition noise, impulse noise mixed in the AC primary power supply (commercial power supply));

(b) noise from digital equipment (e.g. noise from a digital computer for processing image reconstruction);

(c) noise generated in an oscillator which serves as a component part of the NMR apparatus to generate a selective exciting pulse; and (d) noise obtained in such a manner that the noise components in items (a) and (b) is mixed in the oscillator described in item (c) and is amplified, and an amplified noise component is mixed in the FID signal.

In particular, noise in item (d) causes great degradation of the S/N ratio since the oscillator has a high amplification, resulting in a great drawback.

OBJECT OF THE INVENTION

It is an object of the present invention to provide an apparatus and method for examining an object by nuclear magnetic resonance wherein an S/N ratio of an oscillator for generating a selective exciting pulse, which conventionally greatly degrades an S/N ratio of an FID signal is improved to perform highly precise diagnosis.

SUMMARY OF THE INVENTION

These objects stated above may be accomplished by providing a diagnostic apparatus and method utilizing nuclear magnetic resonance techniques comprising:

magnet means for applying to the object a steady magnetic field along a longitudinal axis thereof;

first coil means which is arranged along said longitudinal axis and is energized so as to apply to the object a first gradient field, which in conjunction with the steady field gives a predetermined field in a cross-sectional slice of the object, the field direction of the first gradient field being parallel to that of the steady magnetic field and the absolute value of the field strength thereof increasing linearly in opposite directions from said cross-sectional slice along the longitudinal axis;

probe head coil means for applying RF pulses to the cross-sectional slice of the object in a direction perpendicular to the longitudinal axis so as to excite a nucleus therein to which is being applied the predetermined field combined with the steady field and the first gradient field, and for detecting nuclear magnetic resonance signals derived from the cross-sectional slice of the object;

second coil means for applying a second gradient field to the cross-sectional slice of the object so as to define a projection angle of the nuclear magnetic resonance signals, the field direction of the second gradient field being perpendicular to the steady magnetic field and the strength of the second gradient field being gradient at a right angle with respect to the first gradient field;

a processing unit which receives the nuclear magnetic resonance signals obtained from the cross-sectional slice of the object through the probe head means by changing the strength of the first gradient field, and executes the processing operation on duration times and phase information of the nuclear magnetic resonance signals by use of two-dimensional Fourier transformation changing linearly in an opposite manner along an axis perpendicular to the longitudinal axis; and oscillating means including at least means for generating the RF pulses, means for amplifying the RF pulses derived from the generator means, and means for controlling the amplifying means during and after an RF pulse generator period, respectively.

BRIEF DESCRIPTION OF THE DRAWINGS

The invention may be best understood with reference to the accompanying drawings in which.

DETAILED DESCRIPTION OF THE PREFERRED EMBODIMENTS

Before proceeding with the various types of the preferred embodiments, the fundamental operations of the diagnostic apparatus utilizing NMR techniques in accordance with the present invention will now be explained.

The bias timings of an amplifier element constituting an amplifier section of an oscillator for generating a selective exciting pulse differ according to an oscillation mode and a nonoscillation mode of the oscillator. In the nonoscillation mode, an S/N ratio of a received NMR signal is improved utilizing nonlinear operation characteristics of the amplifier.

An apparatus for examining an object by nuclear magnetic resonance according to an embodiment of the present invention will be described with reference to FIG. 6.

Figure 1A:
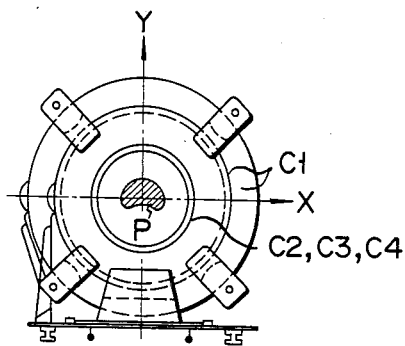
FIG. 1A shows a front view of an air coil employed in the conventional NMR apparatus.
Figure 1B:
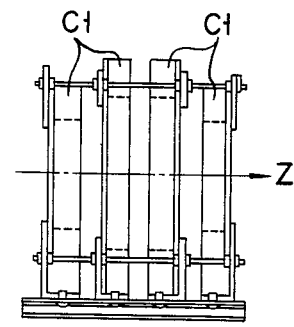
FIG. 1B shows a side view of the air coil shown in FIG. 1A.
Figure 2:
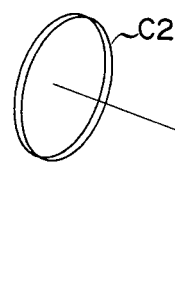
FIG. 2 shows the $G_z$ coil to be used in the NMR apparatus.
Figure 3:
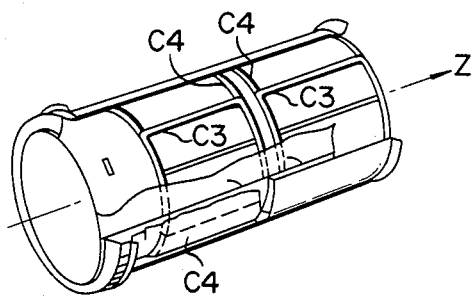
FIG. 3 shows typical $G_x$ and $G_y$ field coils in a practical NMR apparatus.
Figure 4:
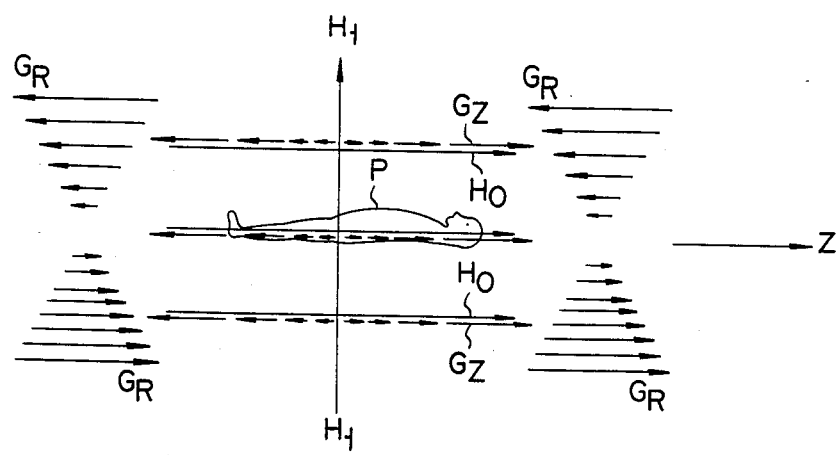
FIG. 4 shows the relationship of the $G_R$ field to other fields.
Figure 5:
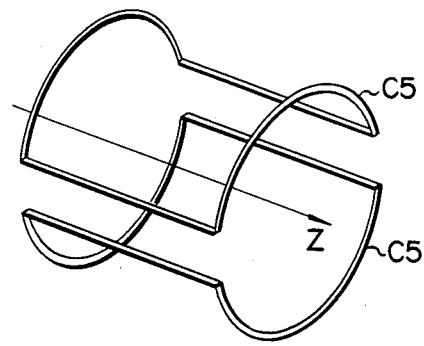
FIG. 5 shows the $H_1$ field coil in that NMR apparatus.
Figure 6:
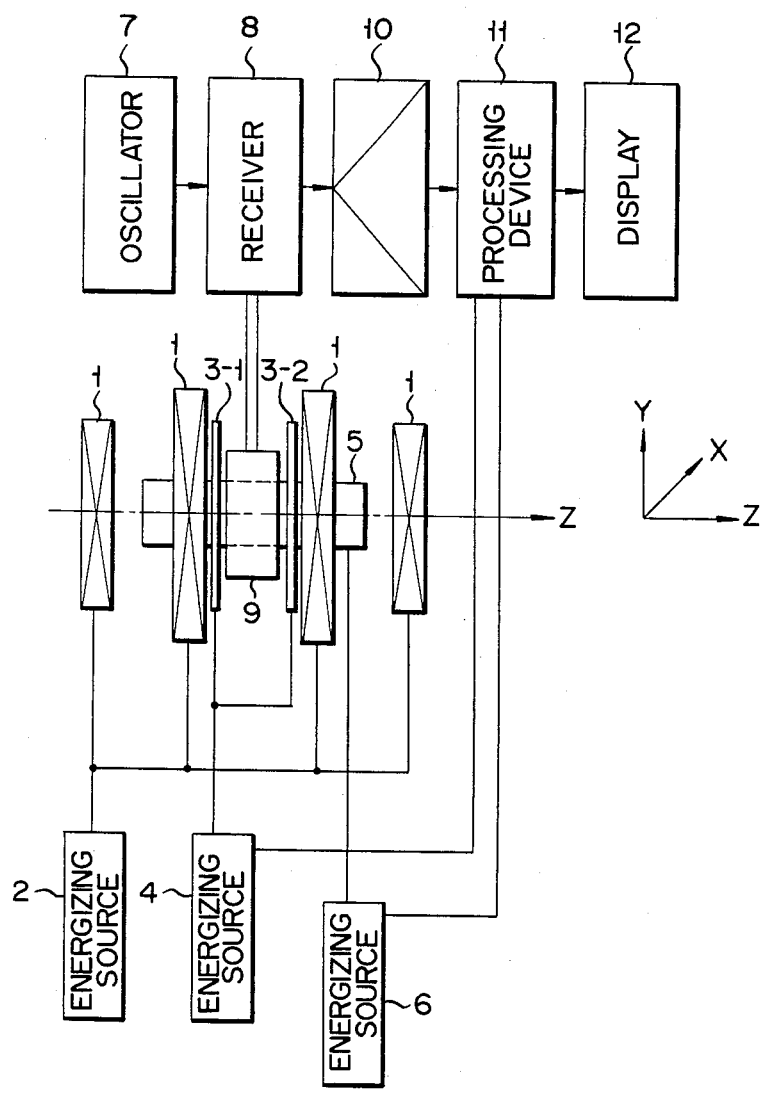
FIG. 6 is a schematic diagram of the complete diagnostic apparatus according to the invention.

Referring to FIG. 6, an air coil assembly has four air coils 1 (e.g., electromagnetic coils). The air coil assembly generates a uniform steady field $H_0$ in the same manner as the air coil C1 shown in FIGS. 1A and 1B. Reference numeral 2 denotes an energizing source for the electromagnetic coils 1. Coils 3-1 and 3-2 constitute a first coil assembly (e.g., Helmholtz coil pair) for generating a linear gradient field $G_z$ applied along a direction (z-axis) of the uniform steady field $H_0$. Reference numeral 4 denotes an energizing source for the coils 3-1 and 3-2. A current flowing through each coil is controlled by a processing device 11 to be described later. Reference numeral 5 denotes a second coil assembly for generating a linear gradient field $G_{x,y}$ in the x-Y plane in a direction perpendicular to the z-axis. The second coil assembly 5 comprises the same saddle-like coils as the coils C3 and C4 (FIG. 3). Reference numeral 6 denotes an energizing source for the second coil assembly 5. The energizing source 6 is controlled by the processing device 11 in the same manner as the energizing source 4. Reference numeral 7 denotes an oscillator for generating a selective exciting pulse; 8, a bridge-type receiver; and 9, a probe head coil. The probe head coil 9 comprises the same coils as the coils C5 (FIG. 5). Reference numeral 10 denotes an amplifier for amplifying the FID signal. The processing device 11 converts the FID signal to a digital signal. The processing device 11 further records and accumulates the digital signals and Fourier-transforms the accumulated signals. The processing device 11 also controls the energizing sources 4 and 6. Reference numeral 12 denotes a display device for displaying the image data obtained by the processing device 11.

The operation of the apparatus for examining an object by nuclear magnetic resonance will now be described.

Figure 7:
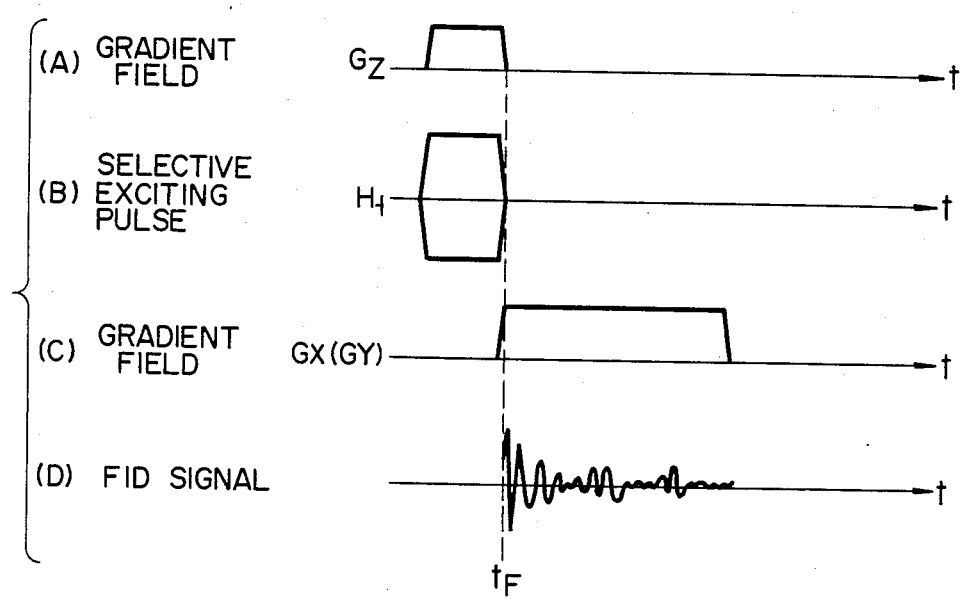
FIG. 7 shows a timing chart for explaining operations of the diagnostic apparatus shown in FIG. 6.

As shown in FIGS. 7A and 7B, the energizing source 2 supplies power to the electromagnetic coils 1 to generate the uniform steady field $H_0$. The uniform steady field $H_0$ is applied to the patient P. The energizing source 4 then supplies power to the coils 3-1 and 3-2 to generate the gradient field $G_z$ along the z-axis. A selective exciting pulse H1 is then applied from the oscillator 7 to the patient P through the bridge-type receiver 8 and the probe head coil 9. The center frequency of the selective exciting pulse H1 is preset to be a value $f_0$ corresponding to the steady field $H_0$, and the frequency difference from the selective exciting pulse H1 is set to be $\Delta f$. Therefore, a cross-sectional slice portion between two flat surfaces corresponding to $\pm G_z$ determined by $\pi \Delta f = \gamma \Delta G_z$ with respect to a surface on which the magnetic field $G_z$ is zero is selected and excited. When the selective exciting pulse is cut off, the gradient field (this gradient field is given as the gradient field $G_x$ along the x-axis by way of simplicity) within the x-Y plane is generated by the coil assembly 5 energized by the energizing source 6, and is applied, as shown in FIG. 7C. The FID signal shown in FIG. 7D is detected and measured through the probe head coil 9. The FID signal is received by the receiver 8 and is amplified by the amplifier 10. The amplified FID signal is then converted by the processing device 11 to a digital signal. The subsequent digital signals are accumulated a predetermined number of times (e.g., $2^5=32$). The accumulated digital signals are processed by Fourier transform or the like, such that a projection image along the x-axis of the plane excited as described above can be obtained.

Figure 8A:
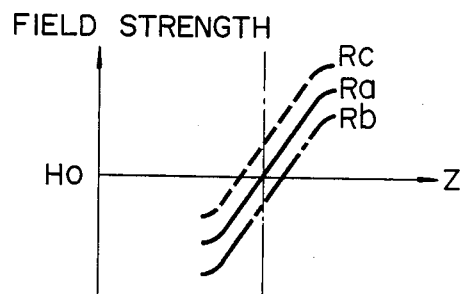
FIGS. 8A and 8B represent an illustration of the selective excitation by the gradient field coil pair.
Figure 8B:
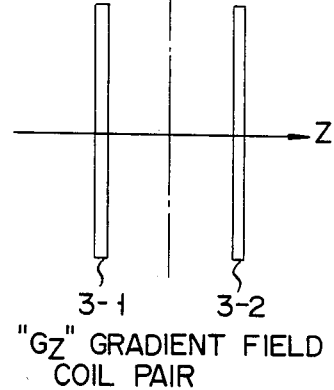

When opposing currents having the same intensity flow through the coils 3-1 and 3-2 which serve as a Helmholtz pair for generating the gradient field $G_z$, the intensity of the gradient field $G_z$ becomes zero at the mid-point between the coils 3-1 and 3-2, so that the selected slice surface is a surface including the mid-point, as indicated by a curve Ra in FIGS. 8A and 8B. However, when a current flowing through the coil 3-2 is decreased, and a current flowing through the coil 3-1 is increased, the zero intensity point is shifted toward the coil 3-2, as indicated by a curve Rb (alternate long and short dashed curve) in FIGS. 8A and 8B. Conversely, when a current flowing through the coil 3-2 is greater than that through the coil 3-1, the zero intensity point is shifted toward the coil 3-1, as indicated by a curve Rc (dotted curve) in FIGS. 8A and 8B. The energizing source 4 is controlled by the processing device 11 to sequentially shift the selected slice, so that projection signals are obtained so as to correspond to the positions thereof along the z-axis, thereby forming a scanogram. The scanogram is then displayed at the display device 12.

As previously mentioned, the apparatus according to the present invention is characterized by an oscillator 7 for generating the selective exciting pulse. The detailed configuration of the oscillator 7 will be described hereinafter.

Figure 9:
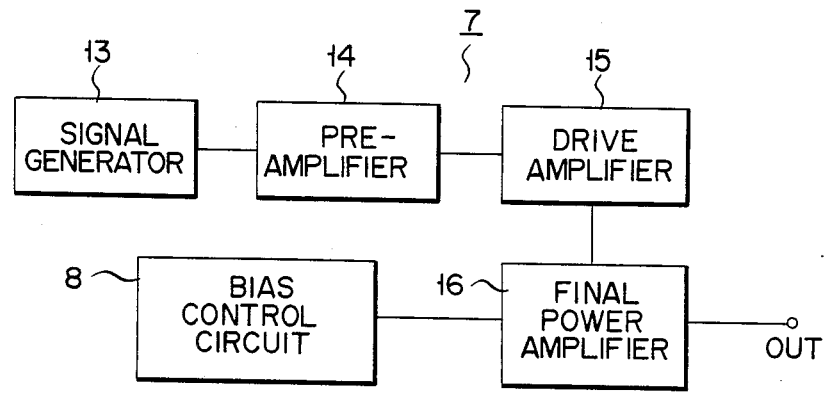
FIG. 9 is a block diagram of the detailed circuit of the oscillator shown in FIG. 6.

FIG. 9 shows a block diagram of the detailed circuit of the oscillator shown in FIG. 6. Referring to FIG. 9, reference numeral 13 denotes a signal generator. An output signal from the signal generator 13 is supplied to a preamplifier 14. An amplified signal from the preamplifier 14 is amplified by a drive amplifier 15 and a final power amplifier 16 to a predetermined level. A bias control circuit 18 is connected to the final power amplifier 16 to control the bias of the amplifier 16. The gains of the amplifiers are set in such a manner that the output signals from the signal generator 13, the preamplifier 14, the drive amplifier 15 and the final power amplifier 16 have a common impedance of 50 $\Omega$, and voltages of about 1 V, 20 V, 150 V, and 700 V, respectively. It should be noted that the gain of the amplifier 16 is variable, as will be described later.

In accordance with the present invention, as the FID signal can be received through the probe head coil 9 immediately after the trailing edge of the selective exciting pulse at time $t_F$ (FIG. 7), the operation point (e.g., A and C classes) of the final power amplifier 16 is shifted so that the amplification of the final power amplifier 16 is varied (with respect to the external and internal noise components previously described).

In other words, while the selective exciting pulse H1 is being applied to the patient P, the gain of the final power amplifier 16 in the oscillator 7 as one of the noise sources is reduced so as not to mix the internal and external noise components in the received FID signal at a high level by the receiver 8. Otherwise, the final power amplifier 16 is turned off during a predetermined period of the FID signal reception. The above operation is based on the fact that the NMR diagnostic apparatus does not perform a reception of the FID signal while the selective exciting pulse H1 is being applied to the patient P. As a result, precisely speaking, these noise components are mixed in the FID signal at the time of reception of the FID signal. However, because the levels of these mixed noise components are suppressed to be very low, the S/N ratio is considerably higher than that in the conventional apparatus.

A practical circuit to which the principle of operation of the present invention is applied will be described in detail.

Figure 10:
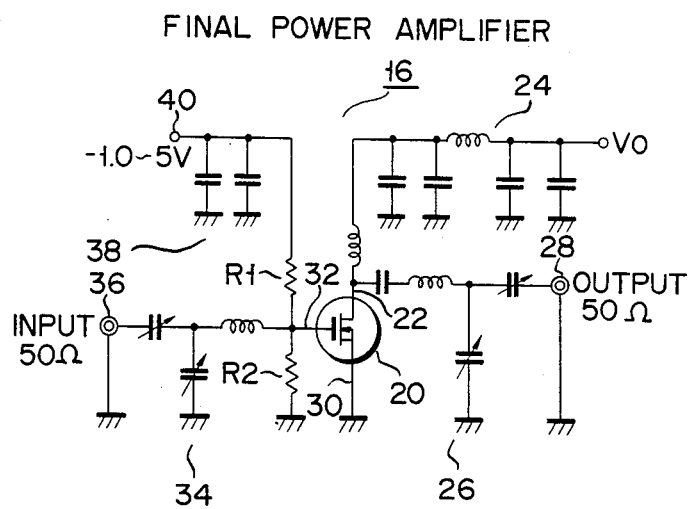
FIG. 10 is a circuit diagram of the practical final power amplifier belonging to the oscillator shown in FIG. 6.

FIG. 10 is a practical circuit diagram of the final power amplifier 16. The arrangement of this circuit is briefly described. A MOSFET (metal oxide semiconductor field effect transistor) 20 is employed as an amplifying element. A drain 22 of the MOSFET 20 is connected to an energizing source $V_0$ through a two-stage output signal blocking circuit 24 (which includes choke coils and capacitors). A predetermined voltage is applied to the energizing source $V_0$. The drain 22 is also connected to an output terminal 28 having an impedance of 50 $\Omega$ through an output matching circuit 26. This matching circuit 26 serves to obtain output matching with respect to the MOSFET 20 by properly adjusting two variable capacitors.

A source 30 of the MOSFET 20 is grounded, and a gate electrode 32 thereof is connected to an input terminal 36 through an input matching circuit 34. As the operational principle of the input matching circuit 34 is the same as that of the output matching circuit 26, a detailed description thereof will be omitted. The input terminal 36 has an impedance of 50 $\Omega$. The gate electrode 32 is also connected to a bias voltage input terminal 40 through a biasing circuit 38. The biasing circuit 38 is arranged to apply a DC bias voltage from a junction-point between two series-connected resistors R1 and R2 to the gate electrode 32. The DC bias voltage is obtained by dividing a DC bias voltage applied from the bias control circuit 18 by the series-connected resistors R1 and R2. Capacitors are further arranged so as not to deliver to the external circuit (e.g., bias control circuit 18) the input signal (i.e., selective exciting pulse) supplied to the input terminal 36.

Figure 11:
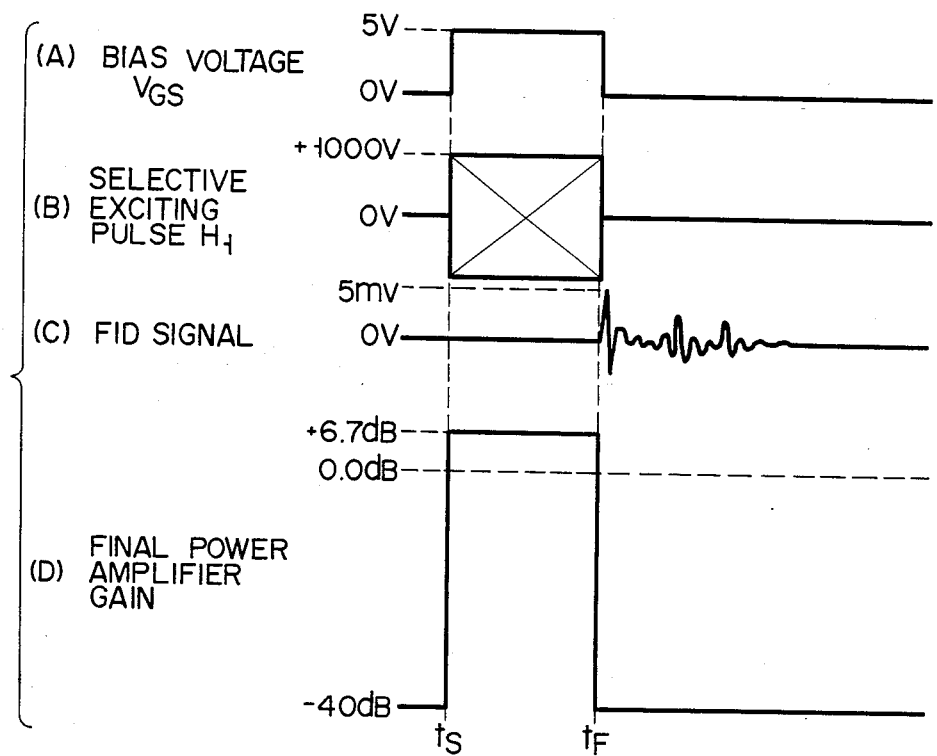
FIG. 11 shows a chart for explaining operations of the final power amplifier shown in FIG. 10.
Figure 12:
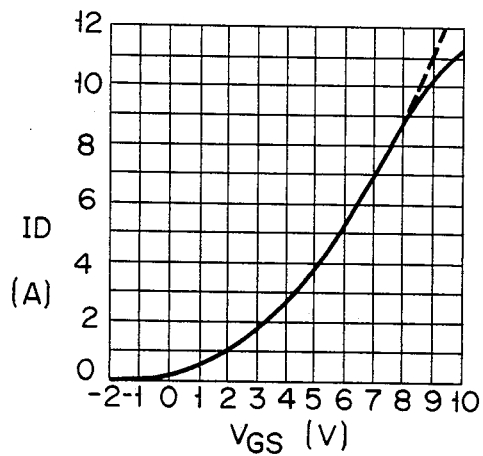
FIG. 12 is a graphic representation of characteristics of MOSFET employed in the amplifier shown in FIG. 10.

In the circuit 16 described above, by changing, in accordance with the signals in FIG. 11 and the characteristics in FIG. 12, a DC bias voltage $V_{GS}$ applied from the bias control circuit 18 and applied to the gate electrode 22 of the MOSFET 20, the gain or amplification of the final power amplifier 16 can be varied. In other words, the operating classes (A to C, C to A etc.) of the MOSFET 20 can be varied. As the arrangement and operation of the bias control circuit 18 is known, a detailed description thereof will be omitted.

More particularly, a drain current $I_D$ has the characteristic curve (FIG. 12) as a function of the gate-source voltage $V_{GS}$ i.e., the above-described DC bias voltage. When the gate-source voltage $V_{GS}$ is substantially zero, the drain current $I_D$ becomes substantially zero. The drain current $I_D$ is not responsive to disturbance noise level of several tens of millivolts. In this stage, the amplifier 16 is set to be a class "C" amplifier. Therefore, the output from the final power amplifier 16 is set to be a level obtained by capacitance coupling of the gate-drain path of the MOSFET 20 and capacitance coupling caused by the layout of the amplifier 16. The amplification of the amplifier 16 becomes about $-40$ dB (FIG. 11D). On the other hand, because the internal noise component of the MOSFET 20 consists of only a leakage current (e.g., about 1 $\mu$A) in the drain-source path, the noise component is negligible.

When the gate-source voltage $V_{GS}$ is increased from 0 V to +5 V, for example, the bias current of the signal from the final power amplifier 16 becomes about 4A (FIG. 12). Therefore, the operating point of the final power amplifier 16 changes from a class "C" amplifier to a class "A" amplifier. The final power amplifier 16 thus serves as a high-gain linear amplifier. In this case, the gain of a small signal is increased several tens of times as compared with that for $V_{GS}=0$ (class "C" amplification). Although disturbance noise is also amplified, the FID signal need not be received during this period (time $t_S$ to $t_F$). At the same time, although the internal noise is also increased during this period, this noise gives no influence in practice.

The following problems are solved according to the present invention. A bias voltage is increased only when the selective exciting pulse is required to be supplied to the final power amplifier 16 during time period $t_S$ to $t_F$, so that the amplifier 16 serves as a class "A" amplifier having high-gain linearity. During this period, although disturbance or external noise and the internal noise level of the output from the final power amplifier 16 is about several hundreds of millivolts, the output signal level is more than 500 V. Furthermore, during this period (time $t_S$ to $t_F$), the FID signal need not be received, so that the external and internal noise components are negligible in practice. When the FID signal needs to be received and amplified after an application of the selective exciting pulse is stopped at time $t_F$, the noise level of the output from the final power amplifier 16 serving as a class "C" amplifier is suppressed to a level of several microvolts. Therefore, the S/N ratio of the FID signal in the apparatus of the present invention is increased by a hundred times or more as compared to that in the conventional apparatus. Therefore, the apparatus of the present invention has an advantage in that image quality can be improved.

While the apparatus according to the present invention has been described in terms of certain preferred embodiments, and exemplified with respect thereto, those skilled in the art will readily appreciate that various modifications, changes, omissions and substitutions may be made without departing from the spirit of the invention.

In the above embodiments, the final power amplification changes from class "A" amplification to class "C" amplification. However, amplification may change from class "A" to "B", "B" to "C", "AB" to "C", or "AB" to "B" so as to improve the S/N ratio.

In the above embodiments, the final power amplifier 16 is set by the bias control circuit 18 into the class "A" amplification mode during time period $t_S$ to $t_F$ (i.e., while the selective exciting pulse H1 is being generated). Moreover, before and after the selective exciting pulse H1 is produced, the final power amplifier 16 is set into the class "C" amplification mode. In other words, the amplifier 16 is operated as a non-linear amplifier during all periods excluding the selective exciting pulse generation period, thereby greatly suppressing amplification of the mixed noise signals. However, the amplifier 16 may be turned off during reception of the FID signals. In such a case, taking account of the spin-spin relaxation time and the spin-lattice relaxation time, this amplifier could be controlled under the following sequence: of class "C" operation (before the pulse H1 is generated), class "A" operation (while the pulse H1 is being generated), turn off (the FID signal collection) and class "C" operation (before the pulse H1 is being generated), thereby increasing the S/N ratio of the FID signal.

In the above embodiments, only the bias of the final power amplifier 16 is variable. However, the bias of either the preamplifier 14 or the drive amplifier 15, or the bias of both of these amplifiers may be also variable to obtain a higher S/N ratio.

The present invention may be applied not only to an NMR apparatus for obtaining a scanogram, but also be applied to an NMR apparatus for obtaining a tomograph by substituting a reconstruction device for the processing device.

What is claimed is:

1. An apparatus for examining an object having a longitudinal axis and a cross-sectional slice perpendicular thereof, by nuclear magnetic resonance, comprising:
    magnet means for applying to said object a steady magnetic field along said longitudinal axis;
    first coil means, which is arranged along said longitudinal axis, for applying to said object a first gradient field, which in conjunction with said steady field provides a predetermined field in said cross-sectional slice of said object, the field direction of said first gradient field being parallel to that of said steady magnetic field and the absolute value of the field strength of said first gradient field increasing linearly in opposite directions from said cross-sectional slice along said longitudinal axis;
    probe head coil means for (a) applying RF pulses to said cross-sectional slice in a direction perpendicular to said longitudinal axis so as to excite nuclei therein which are being subjected to said predetermined field, said RF pulses having a generation period, and (b) for detecting nuclear magnetic resonance signals, having duration times and phase information, derived from said cross-sectional slice;
    second coil means for applying a second gradient field to said cross-sectional slice so as to define a projection angle of said nuclear magnetic resonance signals, the field direction of said second gradient field being perpendicular to said steady magnetic field and the strength of said second gradient field varying linearly, orthogonal to said first gradient field;
    processing means for receiving said nuclear magnetic resonance signals from said probe head means, and for processing said duration times and phase information by use of a two-dimensional Fourier transformation to produce an image of said cross-sectional slice; and
    oscillating circuitry, connected to said processing means, including (a) means for generating said RF pulses, (b) means for amplifying said RF pulses, said amplifying means having at least two different operating modes, and (c) bias control means for controlling said operating modes during and after said RF pulse generation period.

2. An apparatus according to claim 1, wherein:
    said oscillating means further comprises:
    (d) a preamplifier which is connected to said signal generator, (e) a drive amplifier which is connected to said preamplifier, and (f) a final power amplifier including a MOSFET, having a gate electrode, as an amplifying element, whereby said bias control means is coupled to apply a DC bias voltage to said gate electrode in such a manner that said amplifying element is set to A-class during said RF pulse generation period, and to C-class at least during the detection of said nuclear magnetic resonance signals by said probe head coil means.

3. An apparatus for examining an object, having a longitudinal axis and a cross-sectional slice perpendicular thereto, by nuclear magnetic resonance comprising:

magnet means for applying to said object a steady magnetic field along said longitudinal axis;

first coil means, which is arranged along said longitudinal axis, for applying to said object a first gradient field, which in conjunction with said first gradient field provides a predetermined field in said cross-sectional slice of said object, the field direction of said first gradient field being parallel to that of said steady magnetic field and the absolute value of the field strength of said first gradient field increasing linearly in opposite directions from said cross-sectional slice along said longitudinal axis;

probe head coil means for (a) applying RF pulses to said cross-sectional slice of said object in a direction perpendicular to said longitudinal axis so as to excite nuclei therein which are being subjected to said predetermined field, said RF pulses having a generation period, and (b) for detecting nuclear magnetic resonance signals, having duration times and phase information, derived from said cross-sectional slice;

second coil means for applying a second gradient field to said cross-sectional slice so as to define a projection angle of said nuclear magnetic resonance signals, the field direction of said second gradient field being perpendicular to said steady magnetic field and the strength of said second gradient field varying linearly, orthogonal to said first gradient field;

processing means for receiving said nuclear magnetic resonance signals from said probe head means, and for processing said duration times and phase information by use of a two-dimensional Fourier transformation to produce an image of said cross-sectional slice; and oscillating circuitry, connected to said processing means, including (a) a signal generator for producing said RF pulses, (b) an amplifier having an amplifying element for amplifying said RF pulses, and (c) a bias control circuit for activating said amplifying element before and during said RF pulse generation period, and deactivating said amplifying element after said RF pulse generation period.

4. An apparatus as claimed in claim 1, wherein said generator means is a signal generator, said bias control means is a bias control circuit having bias control voltages, and said amplifier means includes (a) a preamplifier coupled to said signal generator, and (b) a power amplifier, having an amplifying element, coupled to said preamplifier and to said bias control circuit, whereby said operating modes are controlled by said bias control circuit during and after said RF pulse generation period.

5. An apparatus as claimed in claim 4, wherein said amplifying element is a MOSFET having a gate electrode, whereby said bias control voltages are applied to said gate electrode so as to set said power amplifier to A class during said RF pulse generation period and to C class after said RF pulse generation period.

6. An apparatus as claimed in claim 4 wherein said amplifying element is a MOSFET having a gate electrode, whereby said bias control voltages are applied to said gate electrode so as to set said power amplifier to A class during said RF pulse generation period and to B class after said RF pulse generation period.

7. An apparatus as claimed in claim 4 wherein the amplifying element is a MOSFET having a gate electrode, whereby said bias control voltages are applied to said gate electrode so as to set said power amplifier to B class during said RF pulse generation period and to C class after said RF pulse generation period.

8. An apparatus as claimed in claim 4 wherein the amplifying element is a MOSFET having a gate electrode, whereby said bias control voltages are applied to said gate electrode so as to set said power amplifier to AB class during said RF pulse generation period and to C class after said RF pulse generation period.

9. An apparatus as claimed in claim 4 wherein the amplifying element is a MOSFET having a gate electrode, whereby said bias control voltages are applied to said gate electrode so as to set said power amplifier to AB class during said RF pulse generation period and to B class after said RF pulse generation period.

10. A method for examining an object having a longitudinal axis and a cross-sectional slice perpendicular thereto, by nuclear magnetic resonance, comprising:

applying a steady magnetic field along said longitudinal axis of said object;

applying a first magnetic gradient field to said object in a direction parallel to said steady magnetic field such that said steady magnetic field and said first gradient field combine to form a predetermined magnetic field in said cross-sectional slice of said object;

generating RF pulses;

amplifying said RF pulses with amplifier means having a gain;

applying said RF pulses to excite nuclei in said cross-sectional slice, said RF pulses being applied in a direction perpendicular to said longitudinal axis during an RF pulse application period;

applying at least one second magnetic gradient field to said cross-sectional slice in a direction orthogonal to said longitudinal axis;

detecting nuclear magnetic resonance signals from said excited nuclei;

processing said nuclear magnetic resonance signals to produce an image of said cross-sectional slice; and controlling said RF amplifier means so that said amplifier gain is high during said RF pulse application period but low after said RF pulse application period.

11. A method according to claim 10 wherein said controlling step includes placing said RF amplifier means in A class during said RF pulse application period and in C class after said RF pulse application period.

12. A method according to claim 10 wherein said controlling step includes placing said RF amplifier means in A class during said RF pulse application period and in B class after said RF pulse application period.

13. A method according to claim 10 wherein said controlling step includes placing said RF amplifier means in B class during said RF pulse applicaton period and in C class after said RF pulse application period.

14. A method according to claim 10 wherein said controlling step includes placing said RF amplifier means in AB class during said RF pulse application period and in C class after said RF pulse application period.

15. A method according to claim 10 wherein said controlling step includes placing said RF amplifier means in AB class during said RF pulse application period and in B class after said RF pulse application period.

* * * * *